(12) United States Patent
Suzuki

(10) Patent No.: US 7,385,289 B2
(45) Date of Patent: Jun. 10, 2008

(54) SEMICONDUCTOR DEVICE USING INORGANIC FILM BETWEEN WIRING LAYER AND BONDING PAD

(75) Inventor: Takehiro Suzuki, Kuwana (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/820,058

(22) Filed: Apr. 8, 2004

(65) Prior Publication Data

US 2004/0201102 A1 Oct. 14, 2004

(30) Foreign Application Priority Data

Apr. 9, 2003 (JP) .............................. 2003-105407

(51) Int. Cl.
*H01L 23/48* (2006.01)
*H01L 29/40* (2006.01)

(52) U.S. Cl. ...................... 257/758; 257/780; 257/784; 438/622

(58) Field of Classification Search ........ 257/758–759, 257/780, 459, E23.151, 760, 784, 772–773, 257/668, 786; 438/612, 614, 618, 118, 622; 258/758, 760
See application file for complete search history.

(56) References Cited

U.S. PATENT DOCUMENTS

| | | | | |
|---|---|---|---|---|
| 5,262,353 A * | 11/1993 | Sun et al. | ..................... | 438/400 |
| 5,965,903 A * | 10/1999 | Chittipeddi et al. | .......... | 257/48 |
| 5,989,991 A * | 11/1999 | Lien | ........................... | 438/612 |
| 6,124,198 A * | 9/2000 | Moslehi | ...................... | 438/622 |
| 6,229,221 B1 * | 5/2001 | Kloen et al. | ................. | 257/784 |
| 6,242,813 B1 * | 6/2001 | Huang et al. | ................ | 257/784 |
| 6,291,331 B1 * | 9/2001 | Wang et al. | ................. | 438/618 |
| 6,392,300 B1 * | 5/2002 | Koike | ........................ | 257/758 |
| 6,614,091 B1 * | 9/2003 | Downey et al. | ............ | 257/499 |
| 6,633,087 B2 * | 10/2003 | Ker et al. | .................... | 257/786 |
| 6,717,270 B1 * | 4/2004 | Downey et al. | ............ | 257/758 |
| 6,727,590 B2 * | 4/2004 | Izumitani et al. | ........... | 257/758 |
| 6,731,007 B1 * | 5/2004 | Saito et al. | ................. | 257/762 |
| 6,740,985 B1 * | 5/2004 | Zhao | .......................... | 257/784 |
| 6,838,769 B1 * | 1/2005 | Chittipeddi et al. | ........ | 257/758 |
| 6,847,124 B2 * | 1/2005 | Semi | ........................... | 257/786 |
| 6,897,570 B2 * | 5/2005 | Nakajima et al. | ........... | 257/786 |
| 6,900,541 B1 * | 5/2005 | Wang et al. | ................. | 257/758 |
| 6,909,196 B2 * | 6/2005 | Batra et al. | ................. | 257/781 |
| 6,921,979 B2 * | 7/2005 | Downey et al. | ............ | 257/773 |

(Continued)

*Primary Examiner*—Theresa T Doan
(74) *Attorney, Agent, or Firm*—Nixon & Vanderhye P.C.

(57) ABSTRACT

It is an object of the present invention to provide a semiconductor device that offers a desirable adhesiveness among the bonding pad, the second insulating layer and the insulating film, and that permits an insulating film formed between a bonding pad and the second wiring layer from being cracked even when stress is applied to the bonding pad from above. In a semiconductor integrated circuit 11a, other wirings 12 are formed so as to avoid the regions right under opposed edges 7a and 7b of the bonding pad 1 and opposed edges 9a and 9b of an inner lead 8. For example, the region in which the other wirings 12 can be formed is selected to be a region 13a between right under the edge 7a of the bonding pad 1 and right under the edge 9a of the inner lead 8, and the region 13b between right under the edge 7b and right under the edge 9b of the inner lead 8. A insulating film 5 formed above these other wirings 12 is made up of an inorganic insulating film only.

13 Claims, 9 Drawing Sheets

U.S. PATENT DOCUMENTS

| | | | |
|---|---|---|---|
| 6,933,614 B2 * | 8/2005 | Lee et al. | 257/780 |
| 6,965,165 B2 * | 11/2005 | Lin | 257/758 |
| 6,977,442 B2 * | 12/2005 | Akagawa et al. | 257/780 |
| 2002/0043723 A1 * | 4/2002 | Shimizu et al. | 257/758 |
| 2004/0256723 A1 * | 12/2004 | Akagawa et al. | 257/734 |

* cited by examiner

FIG. 7 (a) (Prior Art)
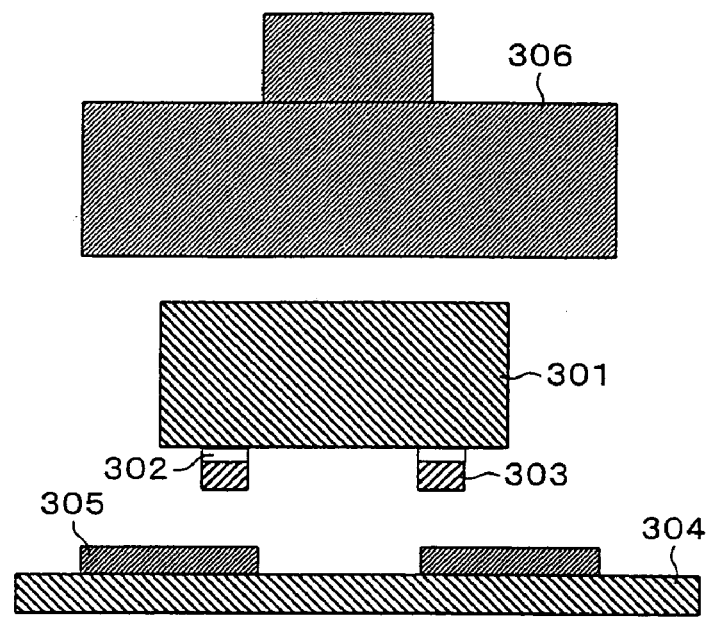
FIG. 7 (b) (Prior Art)
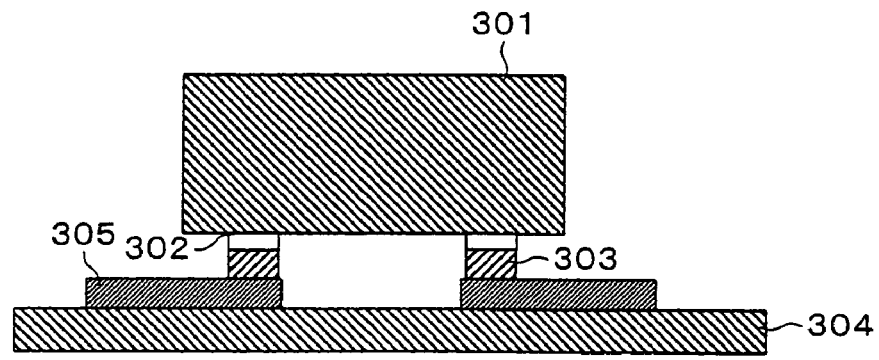

SEMICONDUCTOR DEVICE USING INORGANIC FILM BETWEEN WIRING LAYER AND BONDING PAD

This non-provisional application claims priority under 35 U.S.C. § 119(a) on Patent Application No. 2003/105407 filed in Japan on Apr. 9, 2003, the entire contents of which are hereby incorporated by reference.

FIELD OF THE INVENTION

The present invention relates to a semiconductor device provided with a bonding pad formed above an active region on the surface of a semiconductor substrate.

BACKGROUND OF THE INVENTION

With reduction in size and weight of electric apparatuses for portable phones, portable information terminals, etc., the density of electric equipments to be mounted to these apparatuses has been increasing. In response, semiconductor devices are more and more integrated, and a size of a chip for each semiconductor device has been increasing. On the other hand, smaller processing sizes are demanded to realize lighter weight, thinner and smaller size semiconductor devices, and changes have been made in design rule indicative of the microscopic level of semiconductor devices for smaller size semiconductor devices.

A semiconductor device cut out from a wafer is made up of an active region formed inside and a pad region formed on a surface of a semiconductor device. The active region is made up of an operating region where a transistor, a diode, and other semiconductor element, etc., are formed, and a wiring region where metal wirings are formed, such as an aluminum (Al) wiring, etc., for connecting the semiconductor elements to a predetermined part in the semiconductor device to conduct these semiconductor elements. A pad region is provided for applying a voltage or a signal from an external section of the semiconductor device to an active region, and from the active region to the external section of the semiconductor device. This pad region is a region in the bump to be connected to an external section of the semiconductor device, and a bonding pad is formed in the bump. For a liquid crystal driver as an example of the semiconductor device, the method of mounting an IC (Integrated Circuit) chip on a flexible print circuit, a so-called COF (Chip On FPC (flexible print circuit)) mounting method is generally adopted. For the liquid crystal drivers, a pad region is a region for inputting and outputting signals for liquid crystal driving.

As an example, the COF mounting method will be explained in reference to FIGS. 7(a) and 7(b).

FIG. 7(a) shows a semiconductor element (IC chip) 301, terminal electrodes 302 for input and output formed on the surface of the semiconductor element 301, bonding pads 303 formed on the terminal electrodes 302 for input and output, an insulating film substrate 304, a metal wiring pattern 305 formed on the surface of the insulating film substrate 304 and a bonding tool 306.

Generally, the semiconductor element 301 includes terminal electrodes 302 for input and output on its surface, such as an aluminum pad, etc., and on each of these terminal electrodes 302 for input and output, a bonding pad 303 is formed in a thickness of 10 μm to 18 μm. On the other hand, a flexible print wiring substrate having formed thereon the semiconductor element 301 has the metal wiring pattern 305 formed on the insulating film substrate (film substrate) 304 mainly made up of a plastic insulating material such as polyimide resin, polyester, etc., In the COF mounting system, generally, positioning of the semiconductor element 301 having formed thereon bonding pads 303 is performed with respect to the metal wiring pattern 305 formed on the insulating film substrate 304 as illustrated in FIG. 7(a). Namely, the bonding pad 303 is positioned so as to match a predetermined position on the metal wiring pattern 305.

The metal wiring pattern 305 is made of an electrically conductive material mainly made up of cupper (Cu), and the surface of the electrically conductive substance is plated with tin (Sn) or gold (Au). For the metal wiring pattern 305, an inner lead, an outer lead, an intermediate lead may be adopted. However, differences in types of the metal wiring pattern 305 are not significant, and detailed explanations thereof shall be omitted here.

The insulating film substrate 304 is formed in a band shape, and is called a tape carrier. Along both sides, feed holes are formed at predetermined intervals, so that the insulating film substrate 304 can be moved in a lengthwise direction.

After carrying out the positioning between the insulating film substrate 304 and the semiconductor element 301, the bonding pad 303 and the metal wiring pattern 305 formed on the surface of the insulating film substrate 304 are subjected to the thermo compression bonding using the bonding tool 306, thereby bonding the semiconductor element 301 to the insulating film substrate 304 as shown in FIG. 7(b). This connection method is generally called the inner lead bonding (ILB).

After carrying out the ILB, although not shown, the semiconductor element 301 is sealed with resin such as a material of epoxy resin, silicone resin, etc. To be sealed with resin, specifically, resin is applied from a nozzle over a semiconductor element, and the resin thus applied is hardened with an application of heat such as the reflow system. Thereafter, the portion having mounted thereon the semiconductor element 301 is cut out by the insulating film substrate 304 to be mounted to a liquid crystal display panel as each semiconductor device (integrated circuit).

In the following, the method of packaging the semiconductor device will be explained.

In a conventional semiconductor device, a bonding pad is not formed in the operating region but formed in a circumferential portion of the operating region so that a mechanical pressure when bonding the Au bump to the external connection terminal or stress due to thermal stress, etc., are not applied to the operating region via the bonding pad. Incidentally, bonding pads, for liquid crystal drivers, etc., are generally formed at pitches (intervals) of 50 μm to 100 μm, and are formed in rectangular shape of 40 μm×90 μm, although this size may vary depending on pitches.

In recent years, semiconductor devices have tendencies towards complicated structures of metal patterns connecting elements for a higher density and integration, and generally a multi-layered structure of laminating a plurality of wiring layers is adopted, which in turn increases the number of terminals connecting the semiconductor device to the external terminal up to 500. Therefore, when the region of the bonding pad (pad region) as terminals is formed outside the operating region, the area of the region other than the operating region increases with an increase in number of terminals, and the semiconductor device becomes larger in size, which hinders the lighter weight, thinner and smaller size portable phones, PDAs (Personal Digital Assistant), etc.

In response, a method of forming a bonding pad right above the operating region of semiconductor device has been proposed to realize a smaller size semiconductor device. This method is called "area pad", and hereinafter, the bonding pad formed right above the operating region of the semiconductor device is referred to as an area pad.

Conventional techniques for the area pad will be explained.

The area pad in a semiconductor device of double layer wiring structure is disclosed, for example, by the US Laid-Open patent publication No. 2002-0043723 (published on Apr. 18, 2002) corresponding to Japanese Laid-Open Patent Publication No. 2002-198374/2002 (Tokukai 2002-198374) (published on Jul. 12, 2002) (hereinafter referred to as the first conventional example), and this area pad will be explained in reference to FIG. 8.

As illustrated in FIG. 8, the semiconductor device is made up of a silicone substrate 101 including an operating region where the semiconductor element 120 is formed, a first wiring layer 102 (a part of the wiring region) formed on the silicone substrate 101, the first wiring layer 102 being electrically connected to the operating region, a second wiring layer 107 at above the first wiring layer 102 (a part of the wiring area) via an interlayer insulating film 106, and a bonding pad 112 to be electrically connected to the external section formed above the second wiring layer 107 so that at least a part of the bonding pad 112 is located right above the operating region. The bonding pad 112 includes a barrier metal 113 and a gold bump 114. This barrier metal 113 is formed in the bottom end portion of the boding pad 112 in a vicinity of a bonding face of the bonding pad 112 with the second wiring layer 107. The semiconductor element 120 is an MOS (Metal Oxide Semiconductor) transistor, which is made up of impurity diffusion layer which functions as a source region formed on the surface layer of the silicone substrate 101, and an impurity diffusion layer which functions as a drain region.

The structure of the semiconductor element 120 is not directly to do with characteristic features of the present invention (to be explained later), and detailed descriptions will be omitted here, and only the structures of other elements will be explained. Specifically, the respective structures of the first wiring layer 102 electrically connected to the operating region and the structure of the elements formed above the first wiring layer 102 will be explained.

The first wiring layer 102 has a single layer or multi-layered structure made up of a conductive member such as aluminum, etc. The first wiring layer 102 is formed on the operating region via the insulating film, and includes a plurality of wires. Some of the plurality of wirings of the first wiring layer 102 are connected to the operating region via the contact hole. Above the first wiring layer 102, formed is an interlayer insulating film 106 for insulating the first wiring layer 102 and the second wiring layer 107 (to be electrically disconnected).

The interlayer insulating film 106 is made up of a silicone oxide film 106a, an SOG film 106b and a silicone oxide film 106 which are laminated in this order from the side of silicone substrate 101. The SOG film 106b is provided for making smoother the protrusions and recessions formed on the surface due to the first wiring layer 102. The silicone oxide films 106a and 106c are formed in thickness of, for example, 500 nm.

The second wiring layer 17 is also made up of a conductive member such as aluminum, etc., and has a single layer or multi-layered structure as in the first wiring layer 102. The second wiring layer 107 is formed right under the bonding pad 112, and includes a plurality of mutually insulated wirings. In the figure, wirings 107a, 107b and 107c are formed as these plurality of wirings. Among these wirings 107a to 107c, the wiring 107a is connected to the bonding pad 112. On the other hand, the wirings 107b and 107c are formed in a form of a layer in such a manner that a protective film 108 and a polyimide film 110 are formed between these wirings 107b and 107c and the bonding pad 112. The protective film 108 and the polyimide film 110 have openings 109 and 111 respectively to be connected to the bonding pad 112 and the wiring 107a. The wiring 107b is connected to a part of the first wiring layer 102 via a via-hole of the interlayer insulating film 106.

The bonding pad 112 is connected to the wiring 107a of the plurality of wirings of the second wiring layer 107 via the openings 109 and 111. Here, the contact face of the wiring 107 connected to the bonding pad 112 is significantly smaller than an area of the flat face of the bonding pad 112 (the area projected in an orthogonal direction on the silicone substrate 1). With this structure, it is possible to provide wirings other than the wiring 107a, i.e., the wirings 107b and 107c in the region directly under the bonding pad 112 other than the contact face between the second wiring layer 107 and the bonding pad 112. Incidentally, in the prior art semiconductor device before the first conventional example provided with the area pad is disclosed, the area of the contact face between the wiring layer and the bonding pad (protruded electrode) is substantially the same as the cross sectional area of the bonding pad. In contrast, in the semiconductor device of the first conventional example, the degree of freedom of the wirings of the second wiring layer 107 is increased by reducing the contact face between the second wiring layer 107 and the bonding pad 112.

The protective film 108 and the polyimide film 110 are provided for reducing the interval between the wirings 107b and 107c, and the bonding pad 112. The protective film 108 and the polyimide film 110 are provided between the bonding pad 112 and the second wiring layer 107 for insulating (electrically disconnecting) them in regions other than the contact face between the second wiring layer 107 and the bonding pad 112 including the region between the wirings 107b and 107c and the bonding pad 112. The polyimide film 110 is formed so as to be gradually sloped from the contact face between the second wiring layer 107 and the bonding pad 112 to the outer circumferential portion of the bonding pad 112. This polyimide film 110 serves as an insulating film for electrically insulating the wirings 107b and 107c of the second wiring layer 107, and the bonding pad 112, and also serves as a buffer that reduces a stress due to load and pressure, etc., applied when mounting, for example, by the COF to the bonding pad 112 and prevents the first wiring layer 102 or the second wiring layer under the bonding pad 112 from being damaged.

By the way, the foregoing conventional semiconductor device wherein the first wiring layer and the second wiring layer are formed above the operating region where the semiconductor element is formed, and the bonding pad is formed at above the second wiring layer has such problem that an insulating film between the bonding pad and the second wiring layer is cracked by the loads applied to the bonding pad.

FIG. 9 schematically shows the portion above the second wiring layer of structure of the semiconductor device. In FIG. 9, a second wiring layer 202 is formed in the region right under a bonding pad 201. The second wiring layer 202 is made up of a pad metal 203 connected to the bonding pad 201 to have the same potential with the bonding pad 201, and other wirings 204 insulated from the bonding pad 201 to have different potentials from that of the bonding pad 201. The pad metal 203 corresponds to the wiring 107a in FIG. 8. Furthermore, between the second wiring layer 202 and the bonding pad 201, formed is an inorganic insulating film 201 for insulating the bonding pad 201 from other wirings 204. An inorganic insulating film 205 on the pad metal 203 is an opening for the conduct between the bonding pad 201 and the pad metal 203.

According to the semiconductor device of the foregoing structure, on the inorganic insulating film 205 between the second wiring layer 202 and the bonding pad 201, protrusions and recessions are formed according to the shape of the second wiring layer 202. Furthermore, the protrusions and recessions formed on the inorganic insulating film may cause a crack 211 in the inorganic insulating film 205 with an applied stress from above via the bonding pad 201, which may causes moisture to be seeped, and a corrosion due to the current applied in the portion having moisture seeped, which may result in disconnection. Furthermore, the moisture seeped in a crack 211 becomes a medium, and between the bonding pad 201 and the portion to be insulated from the bonding pad 201 is shorted, or a leak inferior occurs in that the current flows in the part not intended.

In particular, in the case where other wirings 204 are formed in the region right under an edge 201a of the bonding pad 201, or in the region right under the edge 208a of an inner lead 208 when carrying out the ILB of the semiconductor device, it is known that the a crack 211 is liable to be generated in either one or both of the region right under the edge 201a and the region right under the edge 208a. The stress due to the stress from above is most liable to be applied onto the edge 201a of the bonding pad 201 when carrying out the COG (Chip On Glass) mounting, and the COF mounting.

As an example of the COF mounting, it is confirmed by the experiment that when carrying out the ILB with respect to the bonding pad 201 in size of 40 μm×90 μm, with an applied load in a range of 150 N to 200 N at temperatures in a range of 380° C. to 430° C., the bonding pad 201 is expanded in all directions by around 2 μm. Namely, the stress is applied not only from above but also in the lateral directions. The expanded region 201 shown in FIG. 9 indicates the expanded region of the bonding pad 201 in the lateral directions.

Therefore, when mounting, the stress is applied in regions of the bonding pad 201 outside the edge 201a by around 2 to 3 μm, both from above and in lateral directions, and therefore, in the case where other wirings 204 are formed in the region right under the edge 201a and in the region right under the edge 201a before mounting to 2 μm to 3 μm outside the region, the crack 211 is liable to be generated.

Furthermore, when carrying out the inner lead bonding like the case of the COF mounting, for the structure wherein the other wirings 204 are formed in regions right under the edge 208a of the inner lead 208 or regions outside a vicinity of the regions right under to edge 208, a crack may be caused.

As described, irrespectively of the mounting method, the TCP, the COF or the COG, in the case of carrying out the package of the semiconductor device, by electrically connecting the bonding pad 201, the inorganic insulating film 205 is liable to be cracked by the stress. Incidentally, when packaging using the inner lead 208 such as the TCP, the COF, etc., with the stress from the inner lead 208, the inorganic insulating film 205 is liable to be cracked.

In order to avoid the generation of crack, as illustrated in FIG. 8, in the first conventional example, an organic high polymer film such as a polyimide film 110, etc., is formed on the part of the insulating layer between the bonding pad 112 and the second wiring layer 107, to reduce an impact on the second wiring layer 107 from the bonding pad 112. However, the polyimide film 110 is formed at above the second wiring layer 107, and the polyimide film 110 is inclined from the contact face between the second wiring layer 107 and the bonding pad 112 to the outer circumference of the bonding bad 112, thereby generating a new problem of contact inferior.

Incidentally, the barrier metal 113 is formed on the interface between the gold bump 114 and the pad metal 4 and the polyimide film 110, and the polyimide film 110 is made up of an organic insulating material, and has small adhesiveness with the barrier metal 113. As a result, a problem is presented in that the bonding pad 112 is peeled by the external pressure from the interface between the barrier metal 113 and the polyimide film 110.

SUMMARY OF THE INVENTION

The present invention is achieved in finding a solution to the foregoing problem associated with the conventional structure, and it is therefore an object of the present invention to provide a semiconductor device that offers a desirable adhesiveness among the bonding pad, the second insulating layer and the insulating film, and that permits an insulating film formed between a bonding pad and the second wiring layer from being cracked when a stress is applied to the bonding pad from above.

In order to achieve the foregoing object, a semiconductor device of the present invention is characterized by including:

a semiconductor substrate having formed thereon a semiconductor element;

a first wiring layer formed on the semiconductor substrate at above an operating region where the semiconductor element is formed, the first wiring layer being electrically connected to the operating region;

a second wiring layer formed on the semiconductor substrate at above the first wiring layer; and a bonding pad to be electrically connected to an external connection terminal, formed on the semiconductor substrate at above the second wiring layer, at least a part of the bonding pad being located right above the operating region, wherein the second wiring layer includes a plurality of wirings formed in the region right under the bonding pad, a predetermined wiring of the plurality of wirings is connected to the bonding pad, and an insulating film is formed between other wirings than the predetermined wiring among the plurality of wirings, and the bonding pad;

said other wirings provided parallel to the edges of said bonding pad are not formed in regions right under the edges; and the insulating film is made up of an inorganic insulating film only.

According to the foregoing structure, when the bonding pad is electrically connected to the external connection terminal, even when a stress is applied to the bonding pad from above, the other wirings of the second wiring layer provided parallel to the edges of the bonding pad are not formed in regions right under the edges. With this structure, protrusions and recessions are not formed on the surface of the insulating film in regions right under the edges by the other wirings formed parallel to the edges, and the insulating film at this portion is not liable to be cracked.

In the present invention, the foregoing feature that the other wirings provided parallel to the edges of the bonding pad are not formed in regions right under the edges indicate the structure (1) wherein the other wirings are not formed in the regions extended parallel to the edges (side faces), or the structure (2) wherein other wirings are formed in the region extended parallel to the edge and the regions extended parallel to the edges are formed so as to avoid the region right under the edges of the bonding pad.

Incidentally, since the insulating film is made of only an inorganic insulating film, and unlike the case of adopting an organic insulating film such as a polyimide film, the surface of the insulating film can be made smoother, and therefore the bonding strength between the bonding pad and the insulating film can be prevented being reduced when providing the barrier metal on the interface with the insulating film of the bonding pad. As a result, a desirable adhesiveness between the bonding pad and the pad metal of the second wiring layer as well as a desirable adhesiveness between the bonding pad and the insulating film can be realized.

As described, according to the foregoing semiconductor device, a desirable adhesiveness can be realized among the bonding pad, the second wiring layer and the insulating film, and even when a stress is applied to the bonding pad from above, the insulating film between the bonding pad and the second wiring layer can be prevented from being cracked.

In order to achieve the foregoing object, the semiconductor device in accordance with the present invention is characterized by including:

a semiconductor substrate having formed thereon a semiconductor element;

a first wiring layer formed on the semiconductor substrate above an operating region where the semiconductor element is formed, the first wiring layer being electrically connected to the operating region;

a second wiring layer formed on the semiconductor substrate above the first wiring layer; and a bonding pad to be electrically connected to an inner lead by an inner lead bonding process, formed on the semiconductor substrate above the second wiring layer, at least a part of the bonding pad being located right above the operating region, wherein the second wiring layer includes a plurality of wirings formed in the region right under the bonding pad, a predetermined wiring of the plurality of wirings is connected to the bonding pad, and an insulating film is formed between other wirings than the predetermined wiring among the plurality of wirings, and the bonding pad;

the other wirings provided parallel to edges of the bonding pad are not formed in regions right under the edges of the regions electrically connected to the inner lead on the surface of the bonding pad; and the insulating film is made up of an inorganic insulating film only.

According to the present invention, when the bonding pad is electrically connected to the inner lead by the inner lead bonding process, even when stress is applied from above the bonding pad, the other wirings of the second wiring layer formed parallel to the edges of the bonding pad are not formed in regions right under the regions of the bonding pad to be electrically connected to the inner lead. With this structure, protrusions and recessions are not formed on the surface of the insulating film in regions right under the edges by the other wirings formed parallel to the edges, and the insulating film at this portion is not liable to be cracked.

In the present invention, the foregoing feature that the other wirings of the second wiring layer formed parallel to the edges of the bonding pad are not formed in regions right under the regions of the bonding pad to be electrically connected to the inner lead indicates the structure (1) wherein the other wirings are not formed in the regions extended parallel to the edges (side faces), or the structure (2) wherein other wirings are formed in the region extended parallel to the edge and the regions extended parallel to the edges are formed so as to avoid the region right under the edges of the bonding pad.

The region of the bonding pad to be electrically connected to the inner lead indicates the region of the bonding pad occupied by an inner board when bonding the bonding pad to the inner lead by the inner board bonding.

Incidentally, since the insulating film is made of only an inorganic insulating film, and unlike the case of adopting an organic insulating film such as a polyimide film, the surface of the insulating film can be made smoother, and therefore the bonding strength between the bonding pad and the insulating film can be prevented being reduced when providing the barrier metal on the interface with the insulating film of the bonding pad. As a result, a desirable adhesiveness between the bonding pad and the pad metal of the second wiring layer as well as a desirable adhesiveness between the bonding pad and the insulating film can be realized.

In order to achieve the foregoing object, another semiconductor device is characterized by including:

a semiconductor substrate having formed thereon a semiconductor element;

a first wiring layer formed on the semiconductor substrate at above an operating region where the semiconductor element is formed, the first wiring layer being electrically connected to the operating region;

a second wiring layer formed on the semiconductor substrate at above the first wiring layer; and a bonding pad to be electrically connected to an external connection terminal, formed on the semiconductor substrate at above the second wiring layer, at least a part of the bonding pad being located right above the operating region, wherein the second wiring layer includes a plurality of wirings, a predetermined wiring of the plurality of wirings is connected to the bonding pad, and an insulating film is formed between other wirings than the predetermined wiring among the plurality of wirings, and the bonding pad;

the other wirings are formed so as to avoid a regions right under the edges in the lengthwise direction of the bonding pad to 3 μm outside the regions; and the insulating film includes an inorganic insulating film.

As described, according to the foregoing semiconductor device, a desirable adhesiveness can be realized among the bonding pad, the second wiring layer and the insulating film, and even when a stress is applied to the bonding pad from above, the insulating film between the bonding pad and the second wiring layer can be prevented from being cracked.

For a fuller understanding of the nature and advantages of the invention, reference should be made to the ensuing detailed description taken in conjunction with the accompanying drawings.

BRIEF DESCRIPTION OF THE DRAWINGS

FIGS. 7(a) and 7(b) are cross sectional views which explain the ILB of a conventional semiconductor device by the COF mounting.

DESCRIPTION OF THE EMBODIMENTS

First Embodiment

The following descriptions will explain a semiconductor device in accordance with one embodiment of the present invention in reference to FIG. 1 through FIG. 6.

First, the basic structure of a semiconductor device in accordance with the present embodiment will be explained in reference to FIG. 6.

Figure 6:
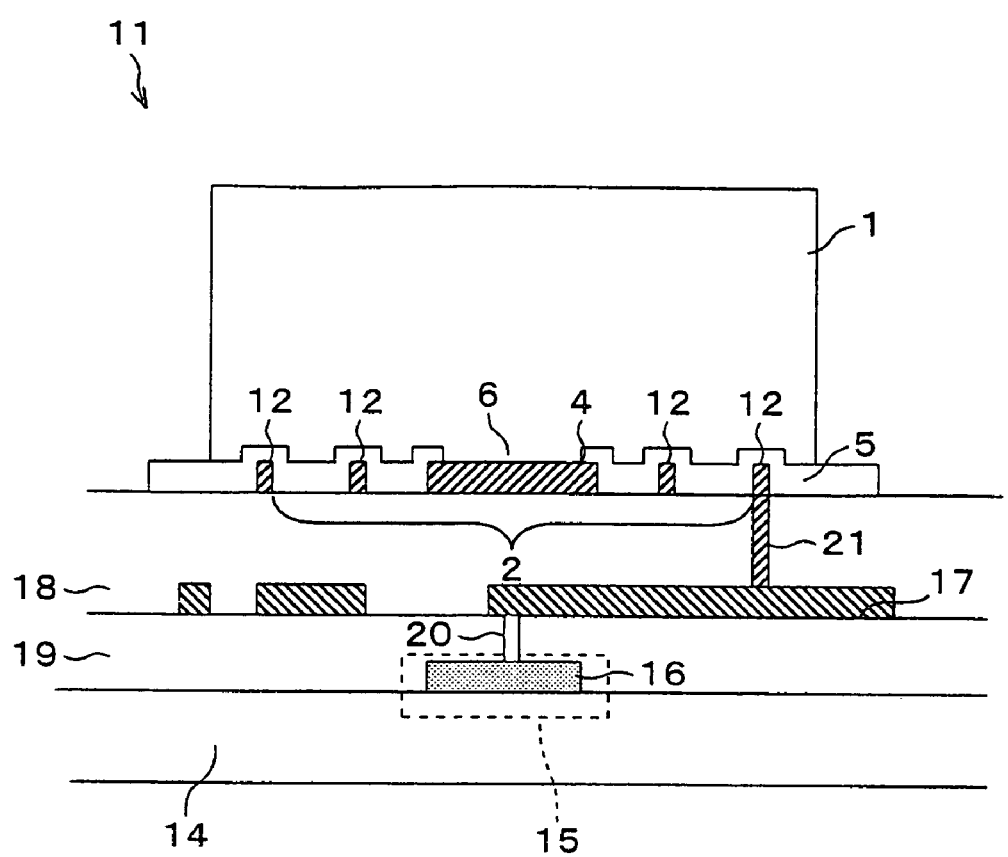
FIG. 6 is a cross sectional view illustrating the basic structure of the semiconductor device in accordance with the embodiment of the present invention.
Figure 8:
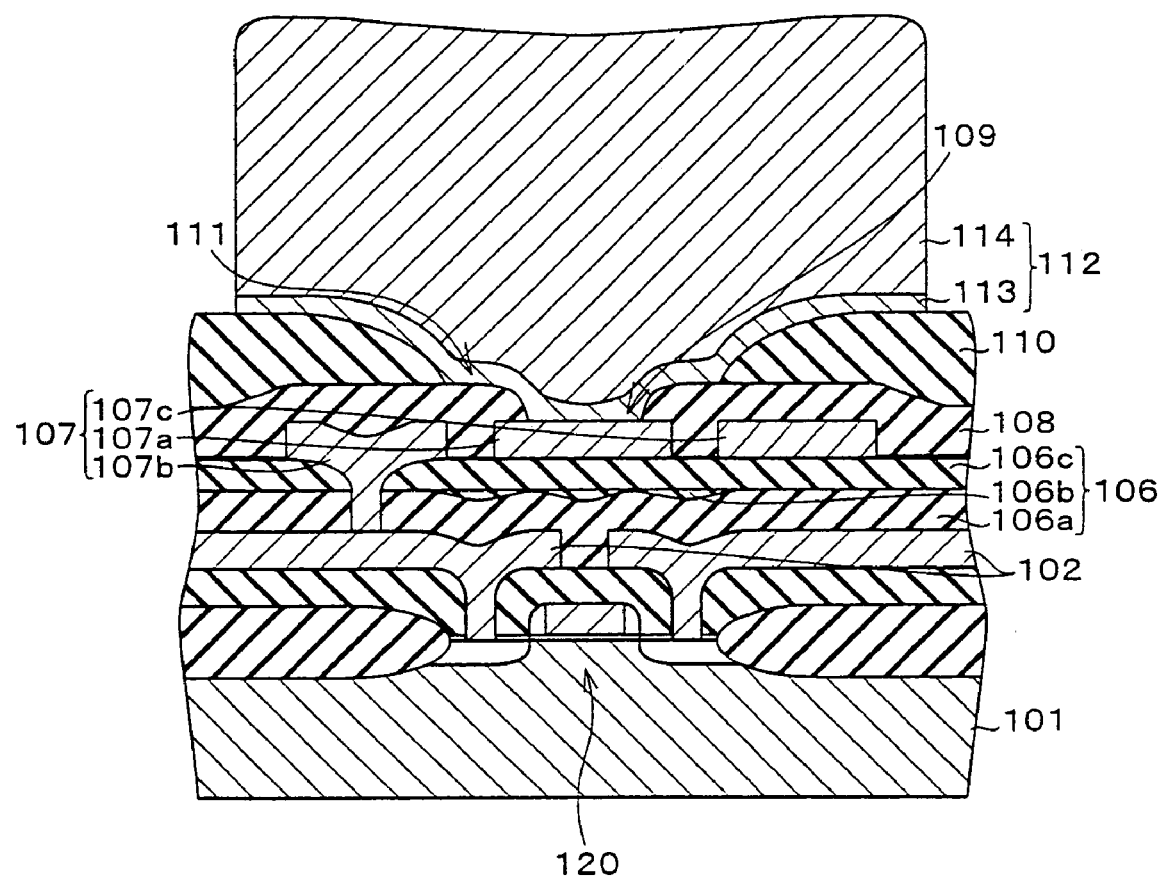
FIG. 8 is a cross sectional view showing the conventional semiconductor device.

FIG. 6 is a cross sectional view of a semiconductor integrated circuit 11 as a semiconductor device in accordance with the present invention. The semiconductor integrated circuit 11 includes a silicone substrate 14 (semiconductor substrate) having formed thereon a semiconductor element including a transistor 16 in a vicinity of a surface. This transistor 16 is an MOS transistor, and on a surface layer of the silicone substrate 14, a region made up of a source region and a drain region are formed. The structure of the semiconductor element of the present invention is generally used, and is not directly to do with the characteristic structure of the present invention, and thus the detailed descriptions thereof shall be omitted here.

The semiconductor element is covered with an insulating film 19. On the silicone substrate 14, a region where the semiconductor element is formed is set to an operating region 15. Above the operating region 15, a first wiring layer 17 is formed via the insulating film 19. The first wiring layer 17 includes a plurality of wires, and has a single layer or multi-layered structure made up of a conductive member such as aluminum, etc. For the first wiring layer 17 of multi-layer structure, for example, a TiW layer having a thickness of 300 nm and an AlSi layer having a thickness of 600 nm are laminated in this order from the side of the silicone substrate. Incidentally, a part of the first wiring layer 17 is electrically connected to the operating region 15 via a contact hole 20 formed in the insulating film 19. Namely, that part of the first wiring layer 17 is electrically connected to the semiconductor element.

Furthermore, above the first wiring layer 17, formed is an interlayer insulating film 18, and further a second wiring layer 2 is formed above the interlayer insulating film 18.

The interlayer insulating film 18 is an insulating film for electrically insulating the first wiring layer 17 and the second wiring layer 2 (non-connected state). This interlayer insulating film 18 includes a silicone oxide film, an application silicone oxide film, an applied silicone oxide film (SOG film) and a silicone oxide film, which are laminated in this order. This applied silicone oxide film (SOG film) is provided for making smoother protrusions and recessions generated by the first wiring layer 17. The silicone oxide film is formed in formed in a thickness of, for example, 500 nm by the CVD (Chemical Vapor Deposition), or other stacking method. In the interlayer insulating film 18, formed is a via-hole 21 for electrically connecting the first wiring layer 17 and the second wiring layer 2.

The second wiring layer 2 includes a plurality of wirings, which are mutually insulated. A predetermined wiring among a plurality of wirings is a pad metal 4. Namely, the plurality of wirings include is made up of the pad metal 4, and other wirings 12. Further, a predetermined wiring of other wirings is connected to a part of the first wiring layer 17 via the via-hole 21. The rest of other wirings of the plurality of wirings 12 are insulated from the first wiring layer 17. The second wiring layer 2 is formed by a conductive member such as an aluminum, etc., and this second wiring layer 2 has a single layer or multi-layered structure. As a example of the second wiring layer 2 of muti-layered structure, the TiW layer formed in thickness of around 150 nm and the AlSi layer formed in thickness of around 1000 nm are laminated in this order from the side of the silicone substrate.

The region where the insulating film 19, the first wiring layer 17, the interlayer insulating layer 18 and the second wiring layer 2 are formed is a wiring region. This wiring region and the operating region form an active region of the semiconductor integrated circuit 11.

A bonding pad 1 is formed above the second wiring layer 2 so that at least a part of the bonding pad 1 is located right above the operating region. When the bonding pad 1 is seen from above, the bonding pad 1 is at least partially overlapped with the operating region. Here, the bonding pad 1 is an area pad, and serves as a connecting section for electrically connecting to an external connection terminal. The plurality of wirings of the second wiring layer 2 are formed right under the bonding pad 1. The pad metal 4 of these plurality of wirings is connected to the bonding pad 1, and are set substantially in the same potential. Other wirings 12 are not connected to the bonding pad 1, and are set in potential different from the potential of the bonding pad 1. Here, the second wiring layer 2 may include wirings other than the above plurality of wirings in a region under the bonding pad 1 in other region than the region right under the bonding pad 1.

Between other wirings 12 and the bonding pad 1, formed is an insulating film 5 for mutually insulating these other wirings 12 and the bonding pad 1. The insulating film 5 is made up of an inorganic insulating film only. This insulating film 5 is a depositional film such as a silicone oxide film or silicone nitride film, etc., formed by the CVD method or other deposition method. The insulating film 5 is formed by two layers of, for example, a $SiO_2$ film in 400 nm thickness and an SiN film in 720 nm thickness.

In the insulating film 5, formed is an opening 6 for connecting the pad metal 4 of the second wiring layer 2 and the bonding pad 1. In the insulating film 5 corresponding to a plurality of wirings of the second wiring layer 2 formed in the region right under the bonding pad 1, other opening than the opening 6 is not formed.

Although not shown, in the bonding pad 1, a barrier metal is formed in an interface between the insulating film 5 and the pad metal 4. The bonding pad 1 is connected to the pad metal 4 of the second wiring layer 2 via the barrier metal. This barrier metal is a metal of high melting point for preventing a reaction between the material of the second wiring layer 2 and the material of metal of the bonding pad 1.

The bonding pad 1, the insulating film 5 and the barrier metal form a pad region of the semiconductor integrated circuit 11.

The arrangement of the second wiring layer 2 will be explained in the following variety of examples.

FIRST EXAMPLE

Figure 1:
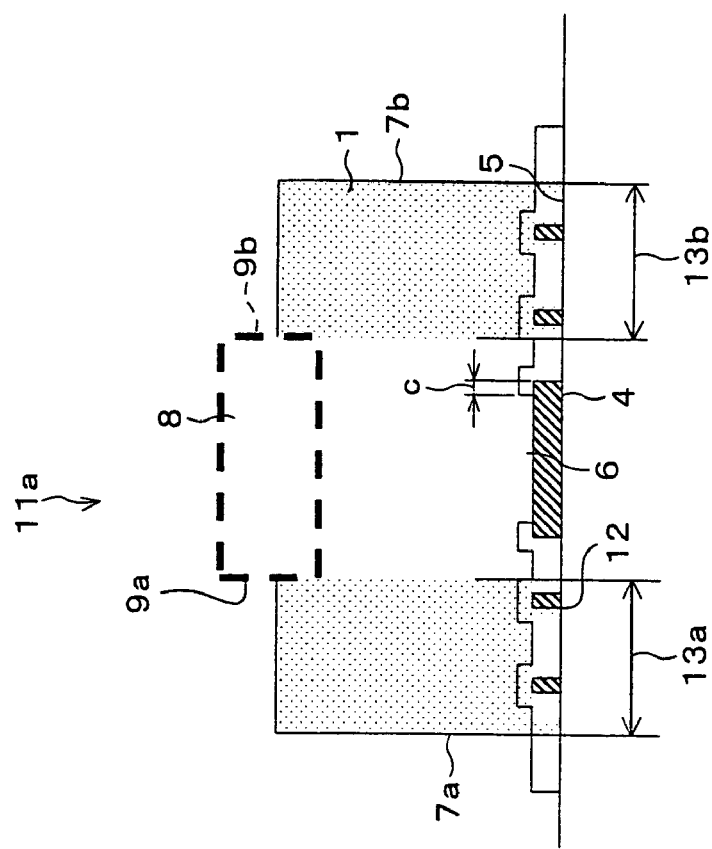
FIG. 1(a) is a perspective plan view illustrating the structure of a semiconductor device in accordance with the first example of the present invention.
FIG. 1(b) is a cross sectional view of FIG. 1(a) taken along an arrow A-A.
Figure 1:
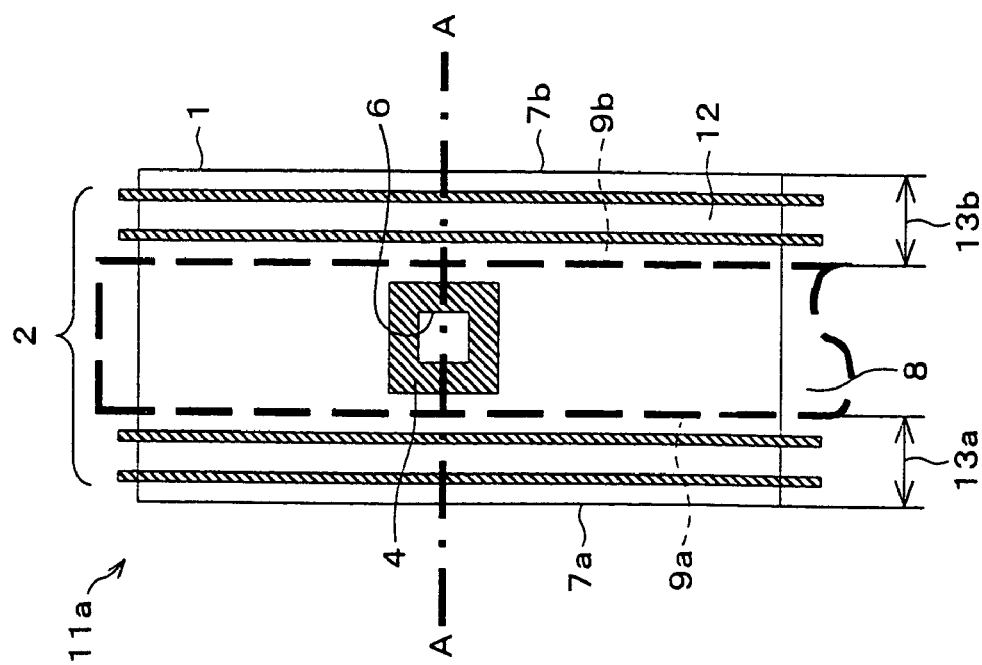

FIG. 1 shows the structure of a semiconductor integrated circuit 11a in accordance with the first example of the semiconductor integrated circuit 11.

FIG. 1(a) is a perspective plan view of the semiconductor integrated circuit 11a when seen from the side of the bonding pad 1, and shows an forming area of the second wiring layer 2 around the bonding pad 1. FIG. 1(a) is a cross-sectional view of FIG. 1(a) taken along an arrow A-A. In FIG. 1(b), the portion below the second wiring layer 2 of the semiconductor integrated circuit 11a is omitted.

For the semiconductor integrated circuit 11a, adopted is the bonding method of bonding the bonding pad to an inner lead (external connection terminal) by the ILB such as the COF, the TCP, etc. FIGS. 1(a) and 1(b) show the state after the ILB.

In FIG. 1(a), the bonding pad is formed in rectangular parallelopiped, and has a rectangular shape when seen from above. Under the bonding pad 1, formed are the pad metal 4 in the same potential as the bonding pad 1, and other wirings 12 in different potential from that of the bonding pad 1. The semiconductor integrated circuit 11 is arranged such that the boning pad 1 is electrically connected to the inner lead (external connection terminal) on the upper surface by the ILB when mounting.

In the foregoing integrated circuit 11a, the other wirings 12 are formed so as to extend in a direction parallel to the lengthwise direction of the bonding pad 1 rectangular in shape. The inner lead 8 is formed so as to have a shorter interval than the distance between opposed edges 7a and 7b in a short side direction of a side face of the bonding pad 1 in a shape of rectangular parallelopiped. The inner lead 8 is formed such that the entire pad metal 4 is located under the area surrounded by the inner lead 8, and that the lengthwise direction of the pad metal 4 is in the lengthwise direction of the bonding pad 1. Between opposed two edges 9a and 9b which determines the width of the inner lead 8, the edge 9a on the side closer to the edge 7a of the bonding pad 1 is formed closer to the side of the edge 7b, and the edge 9b on the side closer to the edge 7b of the bonding pad 1 is formed closer to the edge 7a than the edge 7b. Other wirings 12 are formed in other area than the area right under the edges 7a and 7b of the bonding pad 1 and the edges 9a and 9b of the inner lead 8. At portions right under these edges, other wirings 12 are not formed. As illustrated in FIGS. 1(a) and 1(b), a region in which other wirings 12 can be formed is selected to be a region 13a between right under the edge 7a of the bonding pad 1 and right under the edge 9a of the inner lead 8, and the region 13b between right under the edge 7b and right under the edge 9b of the inner lead 8. Therefore, other wirings 12 are all formed within the area 13a and the area 13b.

Here, the region (width) of the insulating film 5 that covers the pad metal 1 is selected to fall in a range from 2 μm to 5 μm (the region c in FIG. 1(b)).

The edges 7a and 7b of the bonding pad 1 and the edges 9a and 9b of the inner lead 8 receive the stress most, for example, when COF mounting or TOC mounting.

When carrying out the COF mounting, the load and heat are applied from the back surface of the semiconductor element, and the bonding pad 1 is connected to the wiring (external connection terminal), i.e., the inner lead 8. In this state, by arranging such that some of other wirings 12 formed right under the edge of the bonding pad 1 are formed parallel to the edge, the insulating film 5 formed right under the edge causes the protrusions and recessions, which may cause a crack in the insulating film 5 at the portion where these wirings 12 are formed. In response, in this example, the region where other wirings 12 can be formed, i.e., the region 13a and the region 13b are selected to be a region other than the region right under respective edges, thereby preventing a crack in the insulating film 5. Here, other wirings 12 are extended in the direction orthogonal to the edge of the side face orthogonal to the edges 7a and 7b of the bonding pad 1, and thus a crack is not generated in the insulating film 5 at portion right under the edge.

When carrying out the ILB, other wirings 12 may be formed so as to just avoid the region right under the edges 7a and 7b when a crack in the insulating film 5 by other wirings 12 formed right under the edges 7a and 7b of the bonding pad 1 is a problem. In the ILB, in the case where a crack in the insulating film 5 by other wirings 12 only in the area right under the edges 9a and 9b of the inner lead 8 is a problem, other wirings 12 may be formed so as to avoid only the areas right under the edges 9a and 9b. These other wirings 12 may be formed in regions other than an area right under the edge as selected.

Figure 2:
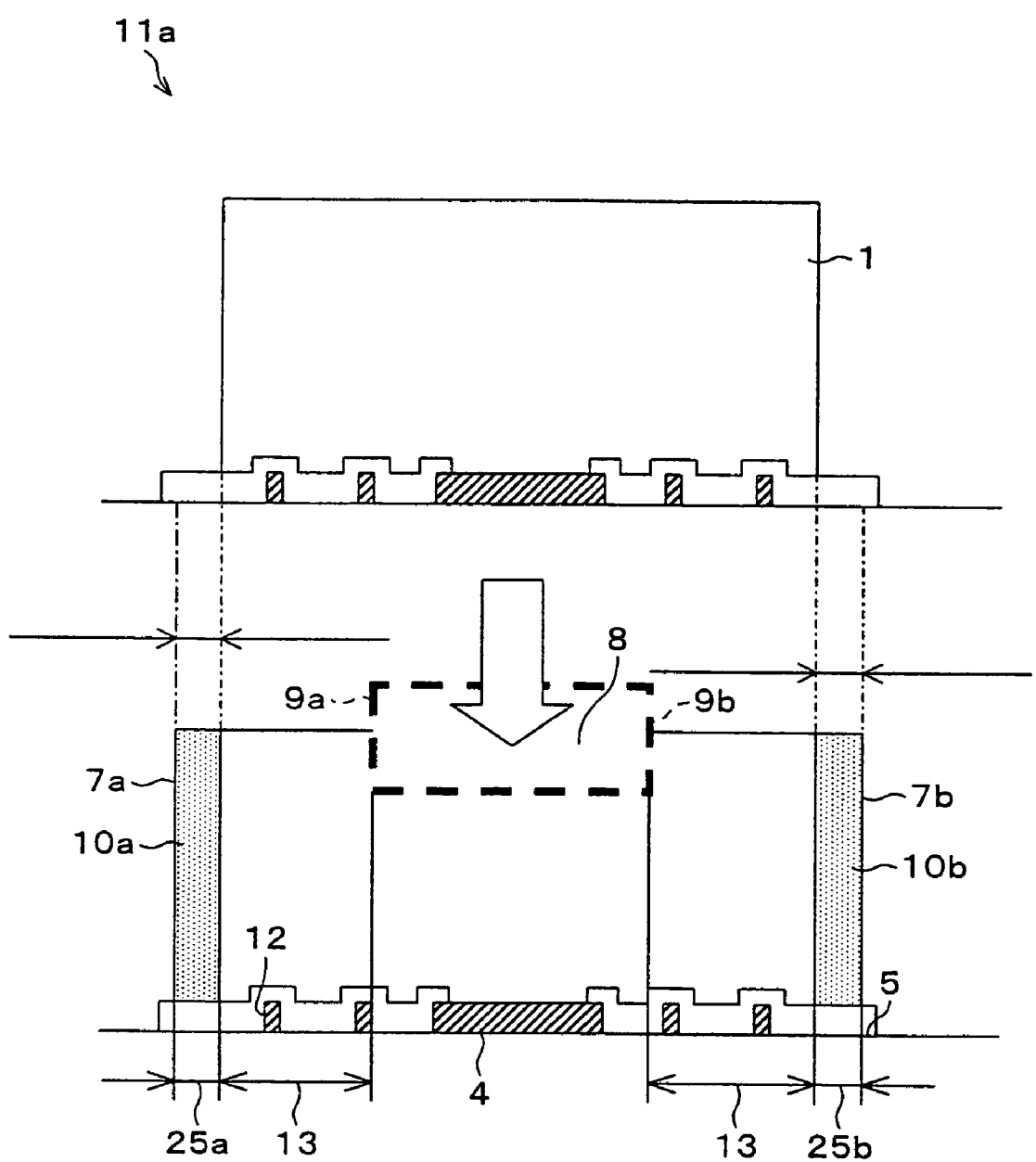
FIG. 2 is a cross sectional view which explains how a bonding pad of the semiconductor device of FIG. 1 is expanded by the ILB.
Figure 9:
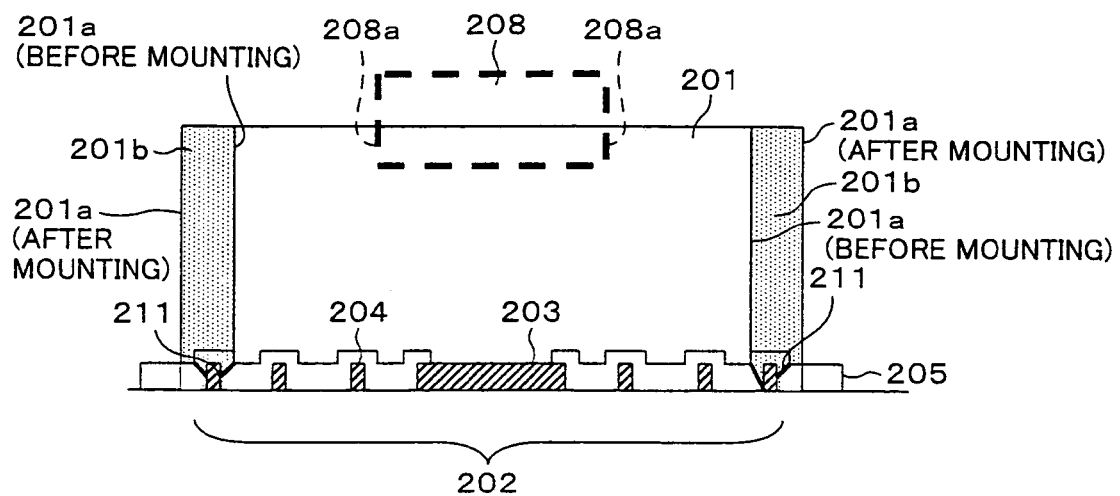
FIG. 9 is a cross sectional view, which explains the state where an insulating film is cracked when mounting a conventional semiconductor device.

When carrying out the inner lead bonding, the stress is applied from above the bonding pad 1, and further, by the stress applied to the bonding pad 1 from above in all directions, the bonding pad 1 is expanded in the lateral direction as shown in FIG. 2. Further, as shown in this figure, the bonding pad 1 is changed from the state before carrying out the ILB indicated in the upper portion in the figure to the state after carrying out the ILB indicated in the lower portion of the figure. In this state, a part of the bonding pad 1 expanded to the side of the edge 7a is indicated by an expanded part 10a, and a part of the bonding pad 1 expanded to the side of the edge 7b is indicated by an expanded part 10b. When carrying out COF mounting, etc., the mounting of the bonding pad 1 is carried out in a state expanded in a lateral direction by 2 to 3 μm. Namely, to the expanded parts 10a and 10b of the bonding pad 1, stress is applied from above and in the lateral direction when carrying out the inner lead bonding As shown in FIG. 9 explained earlier, in the case where the wirings formed in the region other than the region right under the bonding bad 1 before carrying out the inner lead bonding falls in the region right under the expanded region 201b of the bonding pad 1 after carrying out the ILB as other wirings 12, the inorganic insulating film 205 on other wirings 12 may be cracked. The crack 211 may result in the disconnection with other wirings 12, or a short between other wirings 12 and the bonding 1, and a leak inferior.

For example, in the case where the ILB is carried out under a heavier load than that in the normal conditions for the ILB, and the wiring is formed in the region right under the expanded region 201b, it is known that the crack 211 is formed. To increase a load is not an essential condition for the ILB in mass production, and a margin is liable to be narrower. In response, in the example of the present embodiment, as illustrated in FIG. 2, an expanded region 25a right under the expanded region 10a of the bonding pad 1, and an expanded region 25b right under the expanded region 10b are set to the no wiring region. Namely, in order to avoid such condition that the wirings formed in the region other than the region right under the bonding bad 1 before carrying out the inner lead bonding falls in the region right below the expanded regions 10a and 10b of the bonding pad 1 after carrying out the ILB as other wirings 12, these other wirings 12 are formed in region other than the expanded regions 20a and 25b. As a result, in the expanded region 25a, other wirings 12 that extend parallel to the edge 7a which is to be shifted in the expanding direction of the expanded section 10a is not formed, and in the expanded region 25b, other wirings 12 that extend parallel to the edge 7b which is to be shifted in the expanding direction of the expanded section 10b is not formed respectively.

According to the semiconductor integrated circuit 11a of the present embodiment, when the bonding pad 1 is electrically connected to the inner lead 8 (external connection terminal) by the ILB, even if stress is applied to the bonding pad 1 from above, the other wirings 12 of the second wiring layer 2 would not be formed in the region right under the edges 7a and 7b of the bonding pad 1. Therefore, the insulating film 5 right under the edges 9a and 9b of the inner lead 8 would not cause protrusions and recessions by other wirings formed parallel to the edges 9a and 9b, and the insulating film 5 is therefore not liable to be cracked.

As a result, a desirable adhesiveness between the bonding pad 1 and the pad metal 4 of the second wiring layer 2 as well as a desirable adhesiveness between the bonding pad 1 and the insulating film 5 can be realized.

As described, according to the semiconductor integrated circuit 11a, a desirable adhesiveness can be realized among the bonding pad 1, the second wiring layer 2 and the insulating film 5, and even when a stress is applied to the bonding pad 1 from above, the insulating film 5 between the bonding pad 1 and the second wiring layer 2 can be prevented from being cracked.

Furthermore, according to the semiconductor integrated circuit 11a, even if the bonding pad 1 is expanded by the stress when carrying out the ILB, the other wrings 12 are formed so as to avoid the expanded regions 25a and 25b right under the expanded regions 10a and 10b. Therefore, in the expanded regions 25a and 25b, other wirings 12 are not formed in the direction parallel to the edges 7a and 7b to be moved in an expanding direction of the expanded regions 10a and 10b.

The respective lengths of the expanded regions 25a and 25b in the expanding direction of the bonding pad 1 are set to fall in a range of from 2 μm to 3 μm, when mounting the semiconductor integrated circuit 11a, the insulating film 5 can be prevented from being cracked when the bonding pad 1 is electrically connected by the ILB in view of the general expansion of the expanded regions 25a and 25b of the bonding pad 1, i.e., in a range of from 2 to 3 μm.

SECOND EXAMPLE

FIGS. 3(a) and 3(b) show the structure of a semiconductor integrated circuit 11b in accordance with the second example of the semiconductor integrated circuit 11.

FIG. 3(a) is a perspective plan view of the semiconductor integrated circuit 11b when seen from the side of the bonding pad 1, and shows a forming area of the second wiring layer 2 around the bonding pad 1. FIG. 3(a) is a cross-sectional view of FIG. 3(a) taken along an arrow B-B. In FIG. 3(b), the portion below the second wiring layer 2 of the semiconductor integrated circuit 11b is omitted.

For the semiconductor integrated circuit 11b, adopted is the bonding method of bonding the bonding pad to an inner lead (external connection terminal) by the ILB such as the COF, the TCP, etc. FIGS. 3(a) and 3(b) show the state after the carrying out the ILB.

In this example, when carrying out the ILB such as the COF, the TCP, etc., the insulating film 5 can be prevented from being cracked at a region right under the edges 7a and 7b of the bonding pad 1 and a region right under the edges 9a and 9b of the inner lead 8 in the same manner as the first example. In the semiconductor integrated circuit 11b, other wirings 12 are formed so as to avoid the region right under the edges 7a and 7b of the bonding pad 1 and the region right under the edges 9a and 9b of the inner lead 8. Namely, respective regions right under the edges are non-wiring regions. As illustrated in FIGS. 3(a) and 3(b), a region in which other wirings 12 can be formed is selected to be a region 26 between right under the edge 9a and the edge 9b of the inner lead 8 so as to avoid the regions right below the edges 9a and 9b. Therefore, other wirings 12 are all formed within the region 26, and an area between the region right under the edge 7a of the bonding pad 1 and the region right under the edge 9a of the inner lead 8, and an area between the region right under the edge 7b of the bonding pad 1 and the region right under the edge 9b of the inner lead 8 are the non-wiring area.

Furthermore, the other wirings 12 may be formed not only in the region 26 right under the inner lead 8 as in the present embodiment but also in the area 13a between the edge 7a of the bonding pad 1 and the edge 9a of the inner lead 8 and in the area 13b between the edge 7b and the edge 9b.

In the present example, the foregoing region 26 corresponds to the region right under the region of the bonding pad to be electrically connected to the inner lead.

When seen by the cross section along the lengthwise direction of the bonding pad 1, the region 26 covers the entire region of the bonding pad 1, and when seen by the cross section (FIG. 1(b)) along the widthwise direction of the bonding pad 1, the region 26 is expanded from the region corresponding to the pad metal 4 in two opposite directions to the region right under the edge 7a of the bonding pad and the region right under the edge 7b of the bonding pad 1 respectively by around 5 μm (in the case where the width of the inner lead 8 is set to 15 μm, and the width of the bonding pad 1 is set to 5 μm).

According to the semiconductor integrated circuit 11b of the present example, when the bonding pad 1 is electrically connected to the inner lead 8 (external connection terminal) by the ILB, even if a stress is applied to the bonding pad 1 from above, the other wirings 12 of the second wiring layer 2 would not be formed in the region right under the edges 7a and 7b of the bonding pad 1. Therefore, the other wirings 12 extended parallel to these edges are not formed in regions right under the edges 7a and 7b. Therefore, protrusions and recessions are not formed on the surface of the insulating film 5 at a portion right below the edges 7a and 7b by the other wirings 12 formed parallel to the edges 7a and 7b, and the insulating film 5 is therefore not liable to be cracked.

According to the semiconductor integrated circuit 11b of the present embodiment, when the bonding pad 1 is electrically connected to the inner lead 8 (external connection terminal) by the ILB, even if stress is applied from above the bonding pad 1, the other wirings 12 of the second wiring layer 2 would not be formed in the region right under the edges 9a and 9b of the inner lead 8. Therefore, these other wirings 12 formed so as not to be extended parallel to the edges 9a and 9b of the inner lead 8 are not formed in regions right under these edges 9a and 9b. As a result, the insulating film 5 right under the edges 9a and 9b would not cause protrusions and recessions by other wirings formed parallel to the edges 9a and 9b, and the insulating film 5 is therefore not liable to be cracked.

According to the foregoing structure, a ratio of generating a crack in the insulating film 5 on the other wirings 12 due to the stress when carrying out the ILB, thereby preventing moisture from being seeped. As a result, the other wirings 12 can be prevented from being the corrosion, or disconnected due to the current applied in the portion having moisture seeped. In particular, an occurrence of the following problem can be prevented. That is, the moisture seeped in the crack becomes a medium, and between the bonding pad 1 and other wirings 12 is shorted, or a leak inferior occurs between the bonding pad 1 and other wirings 12.

Incidentally, since the insulating film 5 is made of only an inorganic insulating film, and unlike the case of adopting an organic insulating film such as a polyimide film, the surface of the insulating film 5 can be made smoother, and therefore the bonding strength between the bonding pad 1 and the insulating film 5 can be prevented being reduced when providing the barrier metal on the interface with the insulating film 5 of the bonding pad 1. As a result, a desirable adhesiveness between the bonding pad 1 and the pad metal 4 of the second wiring layer 2 as well as a desirable adhesiveness between the bonding pad 1 and the insulating film 5 can be realized.

As described, according to the semiconductor integrated circuit 11b, a desirable adhesiveness can be realized among the bonding pad 1, the second wiring layer 2 and the insulating film 5, and even when a stress is applied to the bonding pad 1 from above, the insulating film 5 between the bonding pad 1 and the second wiring layer 2 can be prevented from being cracked.

As illustrated in FIG. 2 explained in the first example, in the present example, the other wrings 12 are formed so as to avoid the expanded regions 25a and 25b right under the expanded regions 10a and 10b of the bonding pad 1, and the insulating film 5 can therefore be prevented from being cracked in the expanded regions 25a and 25b.

The respective lengths of the expanded regions 25a and 25b in the expanding direction of the bonding pad 1 are set to fall in a range of from 2 to 3 µm, when mounting the semiconductor integrated circuit 11b, the insulating film 5 can be prevented from being cracked when the bonding pad 1 is electrically connected by the ILB in view of the general expansion of the expanded regions 25a and 25b, i.e., in a range of from 2 µm to 3 µm.

THIRD EXAMPLE

Figure 4:
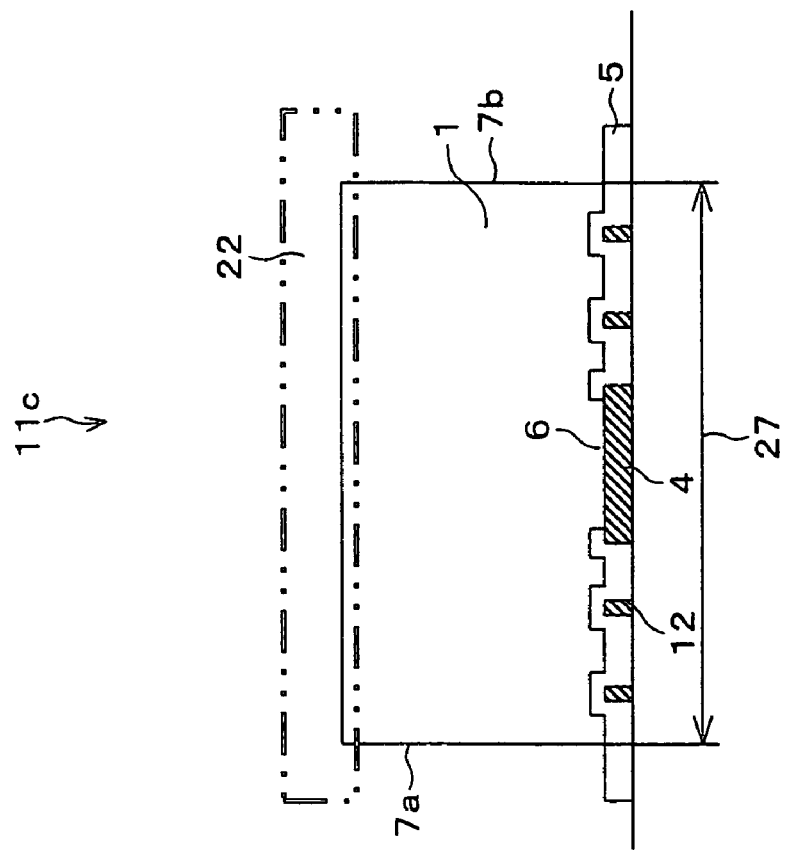
FIG. 4(a) is a perspective plan view illustrating the structure of a semiconductor device in accordance with the second example of the present invention.
FIG. 4(b) is a cross sectional view of FIG. 4(a) taken along an arrow C-C.
Figure 4:
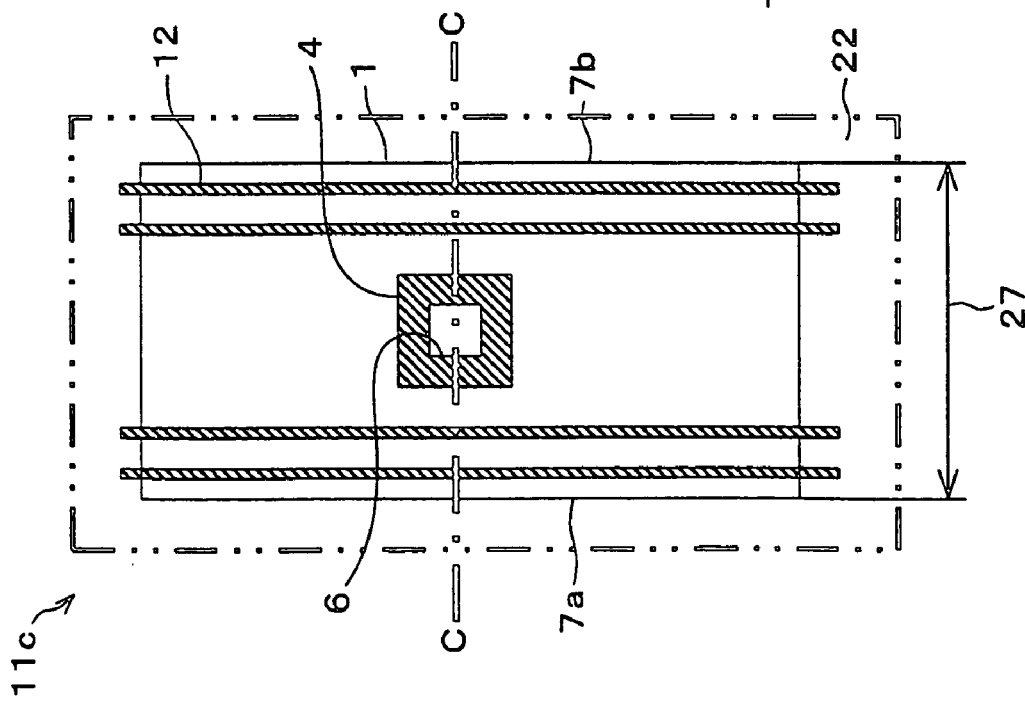

FIG. 4 shows the structure of a semiconductor integrated circuit 11c in accordance with the third example of the semiconductor integrated circuit 11.

FIG. 4(a) is a perspective plan view of the semiconductor integrated circuit 11c when seen from the side of the bonding pad 1, and shows a forming area of the second wiring layer 2 around the bonding pad 1. FIG. 4(a) is a cross-sectional view of FIG. 4(a) taken along an arrow C-C. In FIG. 4(b), the portion below the second wiring layer 2 of the semiconductor integrated circuit 11c is omitted.

In the foregoing first and second examples, explanations have been given through the case of carrying out the ILB such as COF, TCP, etc. In this example, the COG or GOB (Chip On Board) mounting method is adopted without carrying out the ILB. FIGS. 4(a) and 4(b) show the state after carrying out the COG and the COB mounting.

Figure 3:
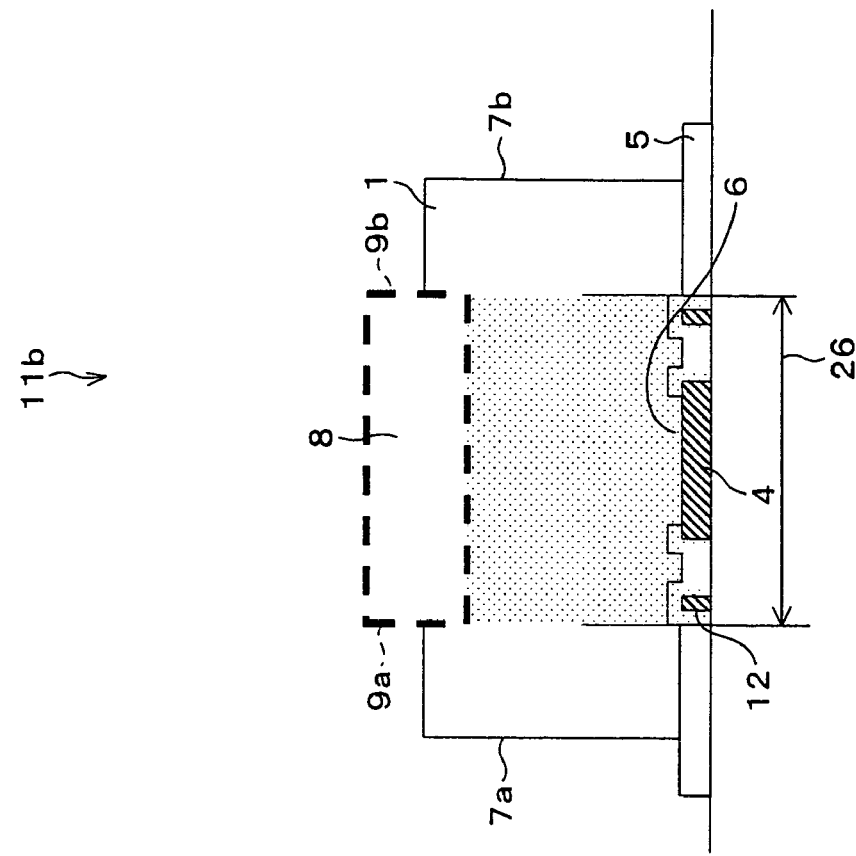
FIG. 3(a) is a perspective plan view illustrating the structure of a semiconductor device in accordance with the second example of the present invention.
FIG. 3(b) is a cross sectional view of FIG. 3(a) taken along an arrow B-B.
Figure 3:
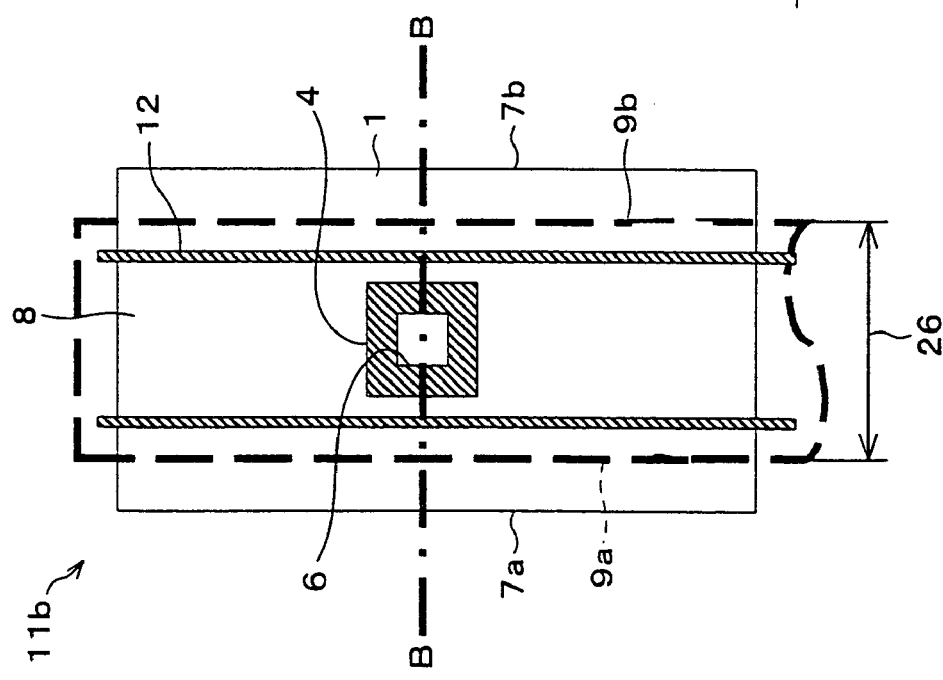

The structure of the present invention is the same as the COF mounting. However, in this example, in the COG or COB mounting, the inner lead is not used as the external connection terminal, and, for example, in the COG, the bonding pad 1 is bonded to an ITO film 22 on the glass substrate by the flip flop bonding. With this structure, the non wiring region as shown in FIG. 1 and FIG. 3 to the regions right under the edges of the inner lead which has edges on the bonding pad can be omitted.

Therefore, in the semiconductor integrated circuit 11c, the region right under the edges 7a and 7b of the bonding pad 1 is set to the non wiring region, and the other wirings 12 are formed so as to avoid the region right below the edges 7a and 7b, and a region in which other wirings 12 can be formed is selected to be a region 27 between the edge 7a and the edge 7b other than the regions right under the edges 7a and 7b.

For example, in the case where a load applied is twice as heavy as that when carrying out the COG mounting, the bonding pad 1 is expanded in all directions by 2 to 3 µm, and the other wirings 12 are formed in the region right below the bonding pad 1, it is known that the insulating film 5 would be cracked.

Figure 5:
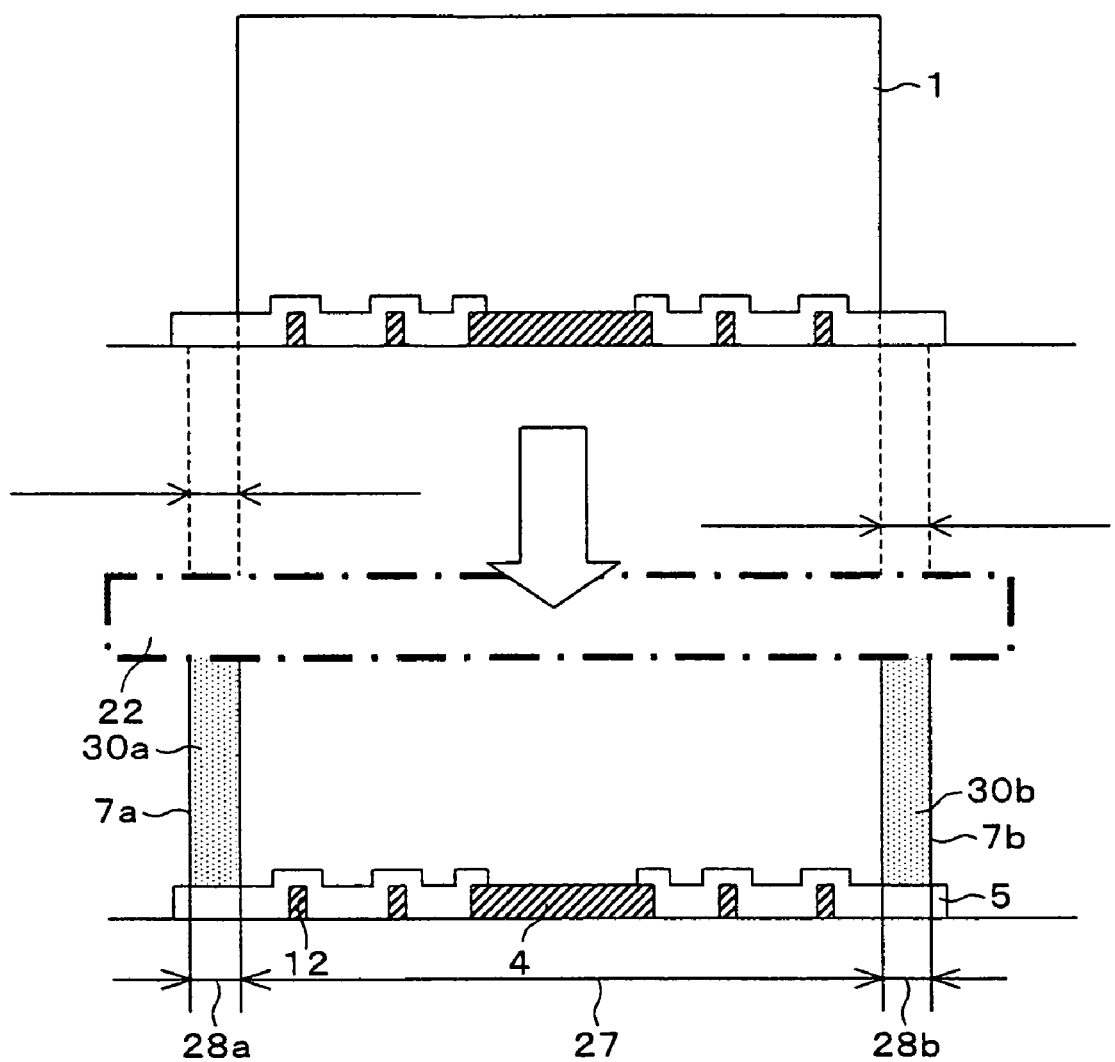
FIG. 5 is a cross sectional view which explains how a bonding pad of the semiconductor device of FIG. 1 is expanded by the COG or the COB.

When bonding to the external connection terminal, the region right under the region where the bonding pad 1 is expanded with the stress when bonding to the external connection terminal 1, i.e., when bonding to the ITO film 22. FIG. 5 shows the state where the bonding pad 1 is changed from the state before carrying out the COG or COB indicated in the upper portion in the figure to the state after carrying out the COG or COB indicated in the lower portion of the figure. As shown in FIG. 5, an expanded region 28a right under the expanded region 30a on the side of the edge 7a of the bonding pad 1, and an expanded region 28b right under the expanded region 30b on the side of the edge 7a of the bonding pad 1 are set to the no wiring region where other wirings 12 are not formed.

According to the semiconductor integrated circuit 11c of the present embodiment, when the bonding pad 1 is electrically connected to the external connection terminal by the COG or the GOB, even if stress is applied from above the bonding pad 1, other wirings 12 of the second wiring layer 2 would not be formed in the region right under the edges 7a and 7b of the bonding pad 1. Therefore, the insulating film 5 right under the edges 7a and 7b would not cause protrusions and recessions by other wirings 12 formed parallel to the edges 7a and 7b, and the insulating film 5 is therefore not liable to be cracked.

According to the foregoing structure, a ratio of generating a crack in the insulating film 5 on the other wirings 12 due to the stress when carrying out the COG or the GOB, thereby preventing moisture from being seeped. As a result, the other wirings 12 can be prevented from being the corrosion, or disconnected due to the current applied in the portion having moisture seeped. In particular, an occurrence of the following problem can be prevented. That is, the moisture seeped in the crack becomes a medium, and between the bonding pad 1 and other wirings 12 is shorted, or a leak inferior occurs between the bonding pad 1 and other wirings 12.

Incidentally, since the insulating film 5 is made of only an inorganic insulating film, and unlike the case of adopting an organic insulating film such as a polyimide film, the surface of the insulating film 5 can be made smoother, and therefore the bonding strength between the bonding pad 1 and the insulating film 5 can be prevented being reduced when providing the barrier metal on the interface with the insulating film 5 of the bonding pad 1. As a result, a desirable adhesiveness between the bonding pad 1 and the pad metal 4 of the second wiring layer 2 as well as a desirable adhesiveness between the bonding pad 1 and the insulating film 5 can be realized.

As described, according to the semiconductor integrated circuit 11a, a desirable adhesiveness can be realized among the bonding pad 1, the second wiring layer 2 and the insulating film 5, and even when a stress is applied to the bonding pad 1 from above, the insulating film 5 between the bonding pad 1 and the second wiring layer 2 can be prevented from being cracked. As a result, a desirable adhesiveness between the bonding pad 1 and the pad metal 4 of the second wiring layer 2 as well as a desirable adhesiveness between the bonding pad 1 and the insulating film 5 can be realized.

As described, according to the semiconductor integrated circuit 11a, a desirable adhesiveness can be realized among the bonding pad 1, the second wiring layer 2 and the insulating film 5, and even when a stress is applied to the bonding pad 1 from above, the insulating film 5 between the bonding pad 1 and the second wiring layer 2 can be prevented from being cracked.

Furthermore, according to the semiconductor integrated circuit 11c, even if the bonding pad 1 is expanded by the stress by the COG or the COB, other wrings 12 are formed so as to avoid the expanded regions 28a and 28b right under the expanded regions 30a and 30b. Therefore, in the expanded regions 28a and 28b, other wirings 12 parallel to the edges 7a and 7b to be moved in an expanding direction of the expanded regions 30a and 30b are not formed.

The respective lengths of the expanded regions 28a and 28b in the expanding direction of the bonding pad 1 to fall in a range of from 2 μm to 3 μm, when mounting the semiconductor integrated c the insulating film 5 can be prevented from being cracked when the bonding pad 1 is electrically connected by the circuit 11c, COG or the COB the general expansion of the expanded regions 28a and 28, i.e., in a range of from 2 to 3 μm.

As described, the semiconductor device of the present invention is arranged such among the plurality of wirings formed right under the bonding pad, other wirings extended in a direction parallel to the edges of the bonding pad are not formed in the regions right under the edges, and the insulating film is made up of an inorganic insulating film only.

As described, the semiconductor device of the present invention is arranged such that in the expanded regions right under the expanded regions with the stress in the process of electrically connecting the bonding pad to the external connection terminal, the other wirings that are extended parallel to the edges to be moved in the direction of expanding the expanded regions are not formed.

Therefore, even when the bonding pad is expanded in the process of electrically connected to the external connection terminal, the insulating film corresponding to the expanded regions can be prevented from being cracked.

According to the semiconductor device of the present invention, the respective lengths of the expanded regions in the expanding direction of the bonding pad are set to fall in a range of from 2 to 3 μm.

Therefore, when mounting the semiconductor integrated circuit, the insulating film can be prevented from being cracked when the bonding pad is electrically connected, in view of the general expansion of the expanded regions, i.e., in a range of from 2 to 3 μm.

As described, the semiconductor device of the present invention is arranged such that the bonding pad and the external connection terminal are electrically connected by the chip-on-glass.

According to the foregoing structure, when the bonding pad is electrically connected to the external connection terminal by the chip on glass, the insulating film can be prevented from being cracked.

As described, the semiconductor device of the present invention is arranged such that the bonding pad and the external connection terminal are electrically connected by the chip-on-board.

According to the foregoing structure, when the bonding pad is electrically connected to the external connection terminal by the chip on board, the insulating film can be prevented from being cracked.

As described, the semiconductor device of the present invention is arranged such that the other wirings formed parallel to the edges of the bonding pad are not formed in regions right under the edges of the bonding pad.

According to the foregoing structure, the insulating film in the regions right under the edges of the bonding pad can be prevented from being cracked.

As described, the semiconductor device of the present invention is arranged such that:

the bonding pad is to be electrically connected to the inner lead by the inner lead bonding process, among a plurality wirings formed under the bonding pad, the other wirings formed parallel to the edges of a region to be electrically connected to the inner lead on a surface of the bonding pad are not formed in regions right under the edges of the region, and an insulating film is made up of an inorganic insulating film.

As described, the semiconductor device of the present invention is arranged such that in expanded regions right under expanded regions of the bonding pad as expanded with the stress in the inner lead bonding process, the other wirings formed parallel to the edges to be moved in an expanding direction of the expanded regions are not formed.

According to the foregoing structure, even when the bonding pad is expanded with the stress in the process of the inner lead bonding, the insulating film corresponding to the expanded regions can be prevented from being cracked.

As described, the semiconductor device of the present invention is arranged such that respective lengths of the expanded regions in the expanding direction of the bonding pad are set to fall in a range of from 2 μm to 3 μm.

According to the foregoing structure, the insulating film can be prevented from being cracked when the bonding pad 1 is electrically connected by the inner lead bonding process in view of the general expansion of the expanded regions in the expanding direction of the bonding pad, i.e., in a range of from 2 μm to 3 μm.

As described, the semiconductor device of the present invention is arranged such that the other wirings are formed so as to avoid regions right under the edges in the lengthwise direction of the bonding pad to 3 μm outside the regions.

As described, the semiconductor device of the present invention is arranged such that the insulating film is made up of a silicone oxide film and a silicone nitride film formed by the CVD method As described, the semiconductor device of the present invention is arranged such that at least some of the other wirings are formed in a region right under the bonding pad, and other wirings formed in the region right under the bonding pad (1) are formed only in a region right under a region electrically connected to the inner lead on a surface of the bonding pad.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:
a semiconductor substrate having formed thereon a semiconductor element;
a first wiring layer formed on said semiconductor substrate above an operating region where said semiconductor element is formed, said first wiring layer being electrically connected to said operating region;
a second wiring layer formed on said semiconductor substrate above said first wiring layer; and
a bonding pad to be electrically connected to an external connection terminal, formed on said semiconductor substrate above said second wiring layer, at least a part of said bonding pad being located above said operating region,
wherein said second wiring layer includes a plurality of wirings formed in the region under said bonding pad, a predetermined wiring of said plurality of wirings is electrically connected to said bonding pad, and an insulating film is provided for insulating said bonding pad from other wirings than the predetermined wiring among said plurality of wirings so that a plurality of wirings of the second wiring layer, which are located directly under the bonding pad, are insulated from the bonding pad by the insulating film, wherein said insulating film is formed over said other wirings so as to directly contact the bonding pad;
said other wirings provided parallel to the edges of said bonding pad are not formed in regions right under the edges, and wherein at least one of said other wirings of said second wiring layer that is insulated from said bonding pad is electrically connected to the first wiring layer by way of a via defined in an insulator located between said first and second wiring layers so that the at least one of the other wirings of said second wiring layer is electrically connected to both (a) the first wiring layer, and (b) the operation region by way of the first wiring layer;
said insulating film is made up of an inorganic insulating film only, so that no organic insulating film is provided between the other wirings and the bonding pad; and
wherein a group of the other wirings of the second wiring layer is not electrically connected to any wiring layer thereunder, whereas said one of the other wirings of the second wiring layer is electrically connected to the first wiring layer which is provided thereunder.

2. The semiconductor device as set forth in claim 1, wherein: said other wirings are not formed in expanded regions right under said expanded regions as expanded with a stress in a process of electrically connecting said bonding pad to an external connection terminal, said other wirings being provided parallel to the edges to be moved in an expanding direction of said expanded regions of said bonding pad.

3. The semiconductor device as set forth in claim 2, wherein: respective lengths of the expanded regions in the expanding direction of said bonding pad are set to fall in a range of from 2 μm to 3 μm.

4. The semiconductor device as set forth in claim 2, wherein: said bonding pad and said external connection terminal are electrically connected by the chip-on-glass.

5. The semiconductor device as set forth in claim 2, wherein: said bonding pad and said external connection terminal are electrically connected by the chip-on-board.

6. The semiconductor device as set forth in claim 1, wherein:
said bonding pad is to be electrically connected to an inner lead by an inner lead bonding process, and
said other wirings formed parallel to the edges of a region to be electrically connected to said inner lead on a surface of said bonding pad are not formed in regions right under the edges.

7. The semiconductor device as set forth in claim 6, wherein: said other wirings are not formed in expanded regions right under said expanded regions as expanded with a stress in the inner lead bonding process, said other wirings being provided parallel to the edges to be moved in an expanding direction of said expanded regions of said bonding pad.

8. The semiconductor device as set forth in claim 7, wherein: the respective lengths of the expanded regions in the expanding direction of said bonding pad fall in a range of from 2 μm to 3 μm.

9. The semiconductor device as set forth in claim 1, wherein: said insulating film is made up of a silicone oxide film and a silicone nitride film, formed by CVD.

10. A semiconductor device, comprising:
a semiconductor substrate having formed thereon a semiconductor element;
a first wiring layer formed on said semiconductor substrate at above an operating region where said semiconductor element is formed, said first wiring layer being electrically connected to said operating region;
a second wiring layer formed on said semiconductor substrate at above said first wiring layer; and
a bonding pad to be electrically connected to an inner lead by an inner lead bonding process, formed on said semiconductor substrate at above said second wiring layer, at least a part of said bonding pad being located right above said operating region,
wherein said second wiring layer includes a plurality of wirings formed in the region right under said bonding pad, a predetermined wiring of said plurality of wirings is connected to said bonding pad, and an insulating film is provided for insulating said bonding pad from other wirings than the predetermined wiring among said plurality of wirings so that a plurality of wirings of the second wiring layer, which are located directly under the bonding pad, are insulated from the bonding pad by the insulating film, and wherein said insulating film is formed over said other wirings so as to directly contact the bonding pad;
said other wirings provided parallel to edges of said bonding pad are not formed in regions right under the edges of the regions electrically connected to the inner lead on the surface of said bonding pad, and wherein at least one of said other wirings of said second wiring layer that is insulated from said bonding pad is electrically connected to the first wiring layer by way of a via defined in an insulator located between said first and second wiring layers so that at least one of the other wirings of said second wiring layer is electrically connected to both (a) the first wiring layer, and (b) the operation region by way of the first wiring layer;

said insulating film comprises an inorganic insulating film only, so that a bottom surface of the bonding pad does not contact any organic insulating film; and wherein a group of the other wirings of the second wiring layer is not electrically connected to any wiring layer thereunder, whereas said one of the other wirings of the second wiring layer is electrically connected to the first wiring layer which is provided thereunder.

11. A semiconductor device, comprising:

a semiconductor substrate having formed thereon a semiconductor element;

a first wiring layer formed on said semiconductor substrate at above an operating region where said semiconductor element is formed, said first wiring layer being electrically connected to said operating region;

a second wiring layer formed on said semiconductor substrate at above said first wiring layer; and a bonding pad to be electrically connected to an external connection terminal, formed on said semiconductor substrate at above said second wiring layer, at least a part of said bonding pad being located right above said operating region, wherein said second wiring layer includes a plurality of wirings, a predetermined wiring of said plurality of wirings is connected to said bonding pad, and an insulating film is provided for insulating said bonding pad from other wirings than the predetermined wiring among said plurality of wirings so that a plurality of wirings of the second wiring layer which are located directly under the bonding pad are insulated from the bonding pad by the insulating film, and wherein said insulating film is formed above said other wirings so as to directly contact the bonding pad;

said other wirings are formed so as to avoid regions right under the edges in the lengthwise direction of said bonding pad to 3 μm outside the regions, and wherein at least one of said other wirings of said second wiring layer that is insulated from said bonding pad is electrically connected to the first wiring layer by way of a via defined in an insulator located between said first and second wirings layers so that at least one of the other wirings of said second wiring layer is electrically connected to both (a) the first wiring layer, and (b) the operation region by way of the first wiring layer;

said insulating film includes an inorganic insulating film, so that no organic insulating film is provided between the other wirings and the bonding pad; and wherein a group of the other wirings of the second wiring layer is not electrically connected to any wiring layer thereunder, whereas said predetermined one of the other wirings of the second wiring layer is electrically connected to the first wiring layer which is provided thereunder.

12. The semiconductor device as set forth in claim 11, wherein: said insulating film is made up of an inorganic insulating film only.

13. The semiconductor device as set forth in claim 11, wherein: at least a part of said other wirings is formed in a region right under said bonding pad, and other wirings formed in the region right under the bonding pad are formed only in a region right under a region electrically connected to an inner lead on a surface of said bonding pad.

* * * * *